United States Patent
Doubrava et al.

(10) Patent No.: US 6,512,809 B2
(45) Date of Patent: Jan. 28, 2003

(54) RADIATION DETECTOR FOR AN X-RAY COMPUTED TOMOGRAPHY APPARATUS

(75) Inventors: Clemens Doubrava, Bonn (DE); Günter Hahn, Shanghai (CN)

(73) Assignee: Siemens Aktiengesellschaft, Munich (DE)

(*) Notice: Subject to any disclaimer, the term of this patent is extended or adjusted under 35 U.S.C. 154(b) by 92 days.

(21) Appl. No.: 10/019,840

(22) PCT Filed: Apr. 26, 2001

(86) PCT No.: PCT/DE01/01617

§ 371 (c)(1),
(2), (4) Date: Apr. 12, 2002

(87) PCT Pub. No.: WO01/84629

PCT Pub. Date: Nov. 8, 2001

(65) Prior Publication Data

US 2002/0131548 A1 Sep. 19, 2002

(30) Foreign Application Priority Data

May 2, 2000 (DE) .......................................... 100 21 367

(51) Int. Cl.⁷ ............................................... H01L 27/00
(52) U.S. Cl. .................. 378/19; 378/98.8; 250/370.09; 250/370.11; 257/428
(58) Field of Search ............................... 378/4, 19, 98, 378/98.8; 250/366, 367, 370.09, 370.11; 257/428

(56) References Cited

U.S. PATENT DOCUMENTS

| 4,845,731 | A | * | 7/1989 | Vidmar et al. ................. 378/98 |
| 5,464,984 | A | * | 11/1995 | Cox et al. .............. 250/370.11 |
| 6,133,574 | A | * | 10/2000 | Blendinger ............ 250/370.11 |
| 6,402,711 | B1 | * | 7/2002 | Tumer .................... 250/370.09 |

* cited by examiner

*Primary Examiner*—Drew A. Dunn
(74) *Attorney, Agent, or Firm*—Schiff Hardin & Waite

(57) ABSTRACT

A detector for a computed tomography apparatus has a number of photodiodes arranged in row form on a printed circuit board, wherein the photodiodes are in each case formed from a substrate and an optically active region provided at the top side of the substrate and a scintillator is applied on the optically active region, and wherein an electrical connection of the optically active region, which connection extends to an underside of the substrate, is opposite a first contact arranged on the top side of the printed circuit board.

14 Claims, 3 Drawing Sheets

RADIATION DETECTOR FOR AN X-RAY COMPUTED TOMOGRAPHY APPARATUS

BACKGROUND OF THE INVENTION

1. Field of the Invention

The present invention is directed to a radiation detector for use in an X-ray computed tomography apparatus.

2. Description of the Prior Art

A photodiode array for an X-ray detector of a computed tomography apparatus is disclosed in German OS 44 42 853 wherein a number of photodiodes are arranged in row form on a substrate. A connection of an optically active region of each photodiode leads away from its narrow side and forms a contact on the substrate. The contact is connected to an electronic evaluation unit via a wire. A further connection of the photocathode is formed e.g. by the substrate.

This known photodiode array is not suitable for constructing densely packed multi-row photodiode arrays, because it is necessary for a multiplicity of wires to be routed away between each row. Moreover, the contact connection and laying of the wires is costly and time-consuming.

German OS 35 03 685 also discloses a detector for computed tomography apparatus having a number of photodiodes arranged in row form, the photodiodes each being formed from a substrate and an optically active region provided at the top side of the substrate, and a scintillator being applied on the optically active region. The optically active region is in each case provided with an electrical connection which extends as far as the underside of the substrate of the photodiode.

German OS 198 41 423 discloses a detector for a computed tomography apparatus which is composed of a multiplicity of individual detectors and whose individual detectors are mounted on a printed circuit board, which produces the required electrical connections also to the individual detectors with contacts opposite the latter.

SUMMARY OF THE INVENTION

An object of the invention is to provide a detector for an X-ray computed tomography apparatus which is constructed as compactly as possible and which can be fabricated as simply and cost-effectively as possible.

This object is achieved in accordance with the invention by a detector for a computed tomography apparatus having a number of photodiodes arranged in row form on a printed circuit board, wherein the photodiodes are in each case formed from a substrate and an optically active region provided at the top side of the substrate and a scintillator is applied on the optically active region, and wherein an electrical connection of the optically active region, which connection extends to the underside of the substrate, is opposite a first contact arranged on the top side of the printed circuit board. The electrical connection has a second contact provided at the edge of the optically active region and a metallization layer is provided on the underside of the scintillator, the underside facing the optically active region, so that when the scintillator is mounted, the second contact is connected to an electrical conductor which is provided at the outer periphery of the substrate and is arranged in a gap formed between two adjacent photodiodes. The inventive detector thus is constructed particularly compactly. It can be fabricated cost-effectively. The opposite arrangement of the first contact and the connection enables direct contact connection. Wiring is not necessary.

DESCRIPTION OF THE PREFERRED EMBODIMENTS

Figure 1:
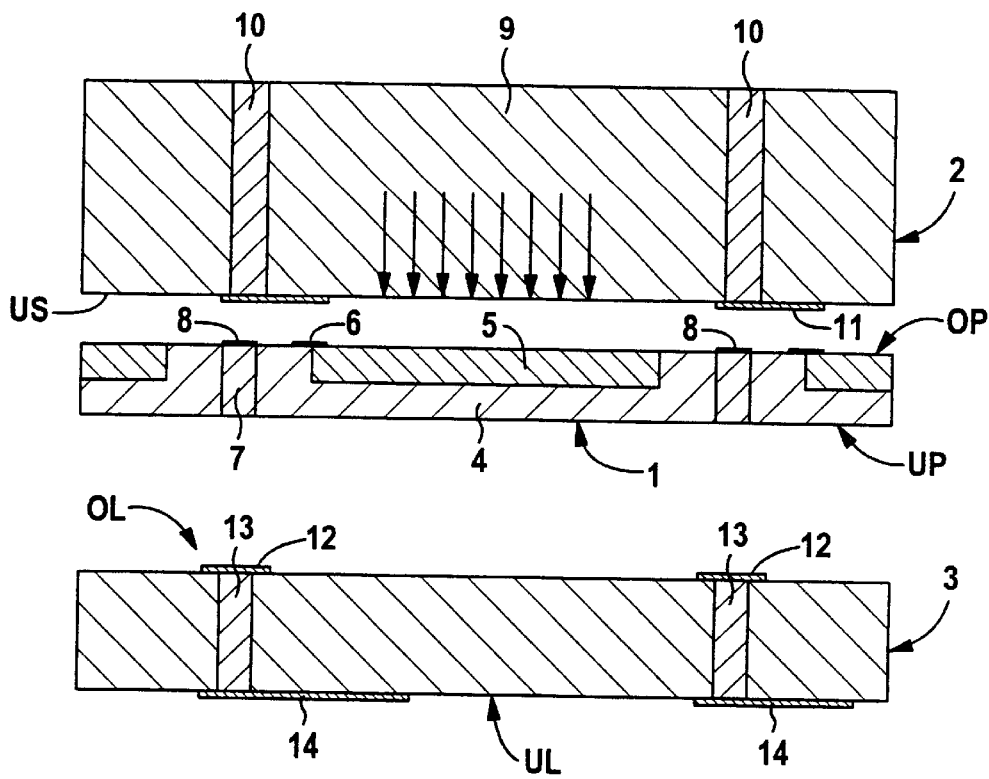
FIG. 1 is a schematic cross-sectional view of a first embodiment of a radiation detector for an X-ray computed tomography apparatus constructed in accordance with the principles of the present invention.

FIGS. 1 to 4 diagrammatically show the construction of a first embodiment of the inventive detector. The detector has a photodiode 1 of a photodiode arrangement, a scintillator 2, and a printed circuit board 3. The photodiode 1 has a substrate 4 having an optically active region 5 at its top side OP. The substrate 4 is preferably a chip fabricated essentially from silicon.

One connection of the photodiode 1 is applied at the optically active region 5 and has a second contact 6 at the edge thereof. An electrically conductive agent 7 is introduced in the interspace between two photodiodes 1 that are arranged next to one another. This agent may be a conductive rubber which cures in a tough-elastic manner. The electrically conductive agent 7 advantageously has a preferred electrical conductivity in one direction, namely from the top side OP to an opposite underside UP of the substrate 4. At top side OP, the electrically conductive agent 7 forms a third electrical contact 8.

The other connection of the photodiode 1 is formed conventionally by the substrate 4 or by a further contact (not shown)

The scintillator 2 is formed of ceramic elements 9 which are separated from one another by optically reflective septa 10. The septa 10 are electrically insulating. At an underside US of the scintillator 2, a metallization layer 11 is applied in the edge region of each scintillator ceramic element 9. The metallization layer 11 is preferably fabricated from a transparent alloy, in particular an InSn alloy.

Situated on the printed circuit board 3, at the top side DL thereof, there is a first electrical contact 12, which is connected via a conductor 13, reaching through the printed circuit board 3, to a further contact 14 provided at the underside UL of the printed circuit board 3.

Figure 2:
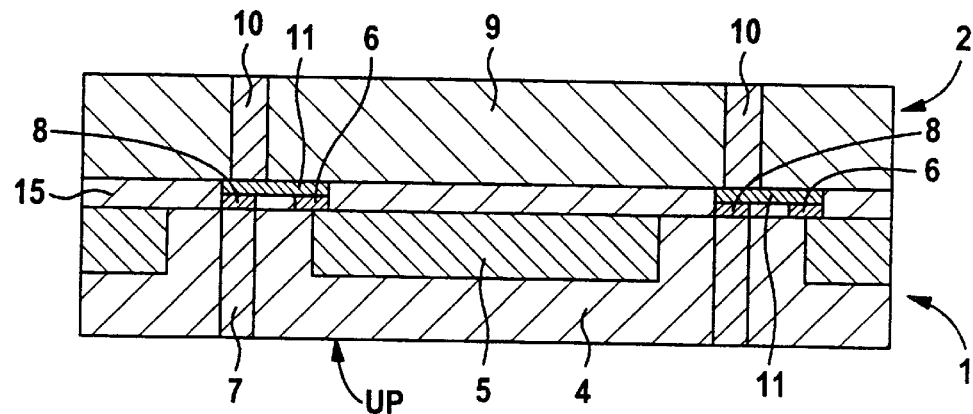
FIG. 2 shows the detector of FIG. 1 in the assembled state.

FIG. 2 shows the photodiode 1 with the scintillator 2 mounted thereon. The metallization layers 11 electrically conductively connect the second electrical contacts 6 to the third electrical contacts 8, thereby forming, via the electrically conductive agent 7, the electrical connection of the optically active region 5, which is led at the external side or peripheral area of the respective photodiode 1 on a particularly short path to the printed circuit board 3. The inventive arrangement does not require a wire to be led from the second electrical contact 6 to the printed circuit board 3. Such an arrangement can be fabricated in a manner that saves time and cost. A transparent adhesive which connects the scintillator to the photodiode arrangement is 30 designated by the reference symbol 15.

Figure 3:
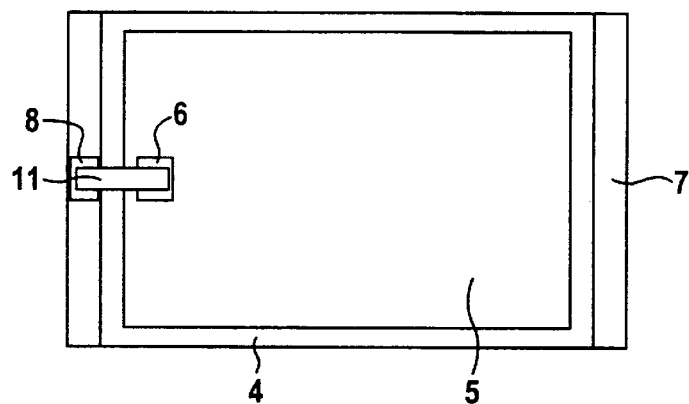
FIG. 3 is a partially schematic, plan view of the detector of FIG. 2.

FIG. 3 partially shows a diagrammatic plan view of the arrangement illustrated in FIG. 2. It reveals, in particular, that the metallization layer 11 is made in the form of a narrow strip. In the mounted state, it connects the second electrical contact 6 to the third electrical contact 8. Both the second electrical contact 6 and the third electrical contact 8 are each made wider than the metallization layer 11. It is thus possible to compensate for mounting tolerances.

Figure 4:
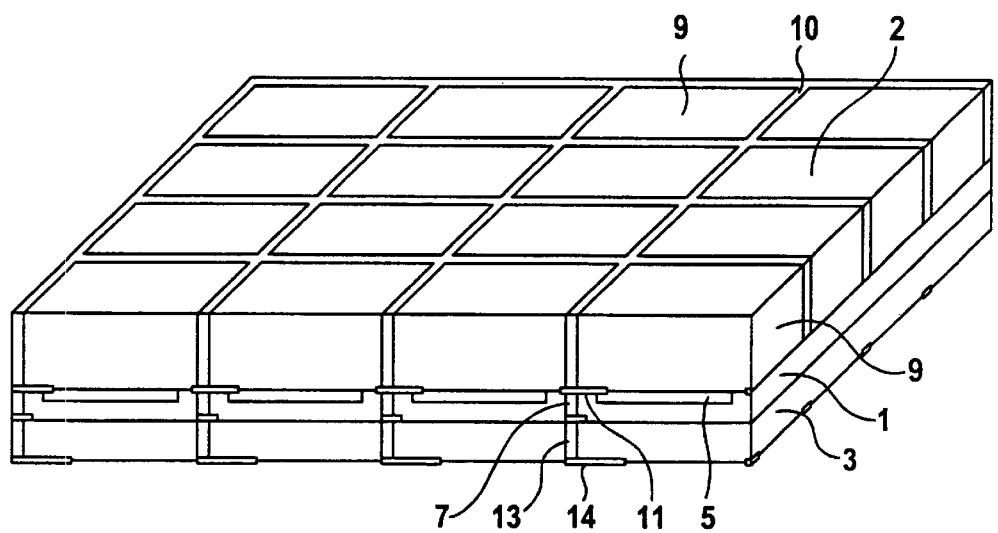
FIG. 4 is a perspective view of a multi-row detector array constructed using a detector as shown in FIGS. 1–3.

FIG. 4 shows, in a perspective view, a detector array which has been fabricated according to the exemplary embodiment explained in FIGS. 1 to 3. The detector array comprises a total of 16 photodiodes 1, on each of which a scintillator ceramic element 9 is mounted. The scintillator ceramic elements 9 are optically isolated from one another by septa 10. The photodiode arrangement is accommodated on a continuous printed circuit board 3. Such a detector array can form a mounting unit which can in turn be mounted onto a further printed circuit board. An electronic evaluation unit, mounted e.g. using SMD technology, can be provided at that side of the further printed circuit board which is opposite the mounting side. That enables the detector to have a particularly compact construction.

Figure 5:
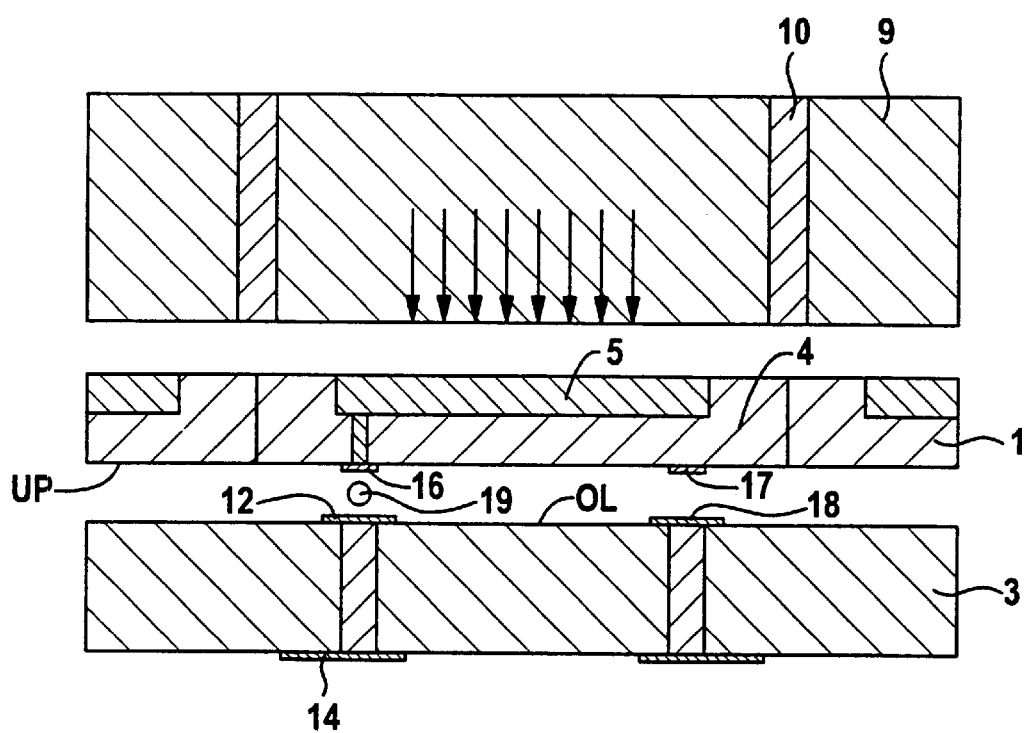
FIG. 5 is a schematic cross-sectional view of a second embodiment of a radiation detector for use in an X-ray computed tomography apparatus, constructed in accordance with the principles of the present invention.

FIG. 5 shows the component parts of a second detector. In the photodiode arrangement, the photodiodes 1 are arranged next to one another without the interposition of an electrically conductive agent 7. The connection of the optically active region 5 is led through the substrate 4 to the underside UP thereof, where it forms a fourth electrical contact 16. The other electrical connection of the photodiode 1 has a fifth electrical contact 17 likewise provided at the underside UP of the photodiode 1.

In order to produce an electrically conductive connection between the fourth electrical contact 16 and the fifth electrical contact 17, respectively, and the first electrical contact 12 and a sixth electrical contact 18 on the top side OL of the printed circuit board 3, it is possible to apply a solder 19 having a low melting point e.g. on the first electrical contact 12 and the sixth electrical contact 18, respectively. After the application of the photodiodes 1 the electrical solder 19 can be melted by the action of a sufficient temperature and a direct electrical connection, i.e. one without the use of a wire, can thus be produced between the electrical contacts 12, 16, 17 and 8. For the rest, the detector is constructed analogously to the first exemplary embodiment.

The detector of the second embodiment can be constructed even more compactly than the detector of the first embodiment, because the electrically conductive gent 7 between the photodiodes 1 is no longer required.

Although modifications and changes may be suggested by those skilled in the art, it is the intention of the inventors to embody within the patent warranted hereon all changes and modifications as reasonably and properly come within the scope of their contribution to the art.

What is claimed is:

1. A radiation detector for a computed tomography apparatus, comprising having a plurality of photodiodes arranged in row form on a printed circuit board, each of the photodiodes being formed from a substrate and an optically active region disposed at a top side of the substrate and a scintillator applied on the optically active region and an electrical connection of the optically active region extending to an underside of the substrate, disposed opposite a first contact disposed at top side of the printed circuit board, the electrical connection having a second contact at an edge of the optically active region and a metallization layer on an underside of the scintillator, said underside facing the optically active region, so that when the scintillator is mounted, the second contact is connected to an electrical conductor at an outer periphery of the substrate and disposed in a gap formed between two adjacent photodiodes.

2. The detector as claimed in claim 1, wherein the electrical conductor is a composition which cures in a tough-elastic manner, preferably a conductive rubber.

3. The detector as claimed in claim 1, wherein the metallization layer is fabricated from a transparent alloy.

4. The detector as claimed in claim 1, wherein the scintillator is fixed on the photodiode by an optically transparent adhesive in a region that faces the metallization layer.

5. The detector as claimed in claim 1, wherein one electrical connection is led through the substrate to a fourth contact arranged at the underside of the substrate, said fourth contact being disposed opposite the first contact in the mounted state.

6. The detector as claimed in claim 1, comprising another electrical connection of the photodiode formed by the underside of the substrate, which, when said scintillator is mounted, is opposite a sixth contact on the surface of the printed circuit board.

7. The detector as claimed in claim 5, wherein the first contact and fourth contact are connected by a solder having a low melting point.

8. The detector as claimed in claim 1, wherein a plurality of rows of photodiodes are arranged next to one another, forming an arrangement comprising rows and columns.

9. The detector as claimed in claim 1, comprising an electrical circuit fabricated using SMD technology disposed at an underside of the printed circuit board, said underside being opposite the top side.

10. The detector as claimed in claim 1, comprising a further printed circuit board on which said electrical circuit is disposed, mounted onto the underside of the printed circuit board.

11. The detector as claimed in claim 1 wherein the metallization layer is comprised of an InSn alloy.

12. A detector as claimed in claim 6 wherein said fifth and sixth contacts are connected by a solder having a low melting point.

13. A detector as claimed in claim 1 wherein said first contact is connected to a conductor proceeding through said printed circuit board.

14. A detector as claimed in claim 6 wherein said sixth contact is connected to a conductor proceeding through the printed circuit board.

* * * * *